(12) United States Patent
Joshi et al.

(10) Patent No.: US 10,903,186 B2
(45) Date of Patent: Jan. 26, 2021

(54) POWER ELECTRONIC ASSEMBLIES WITH SOLDER LAYER AND EXTERIOR COATING, AND METHODS OF FORMING THE SAME

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/165,563

(22) Filed: Oct. 19, 2018

(65) Prior Publication Data
US 2020/0126944 A1  Apr. 23, 2020

(51) Int. Cl.
*H01L 23/31* (2006.01)
*H01L 23/00* (2006.01)

(52) U.S. Cl.
CPC .......... *H01L 24/29* (2013.01); *H01L 23/3185* (2013.01); *H01L 24/83* (2013.01); *H01L 2224/29111* (2013.01); *H01L 2224/29575* (2013.01); *H01L 2224/32245* (2013.01); *H01L 2224/8383* (2013.01)

(58) Field of Classification Search
CPC ..... H01L 24/29; H01L 24/83; H01L 23/3185; H01L 2224/8383; H01L 2224/29575; H01L 2224/32245; H01L 2224/29111
See application file for complete search history.

(56) References Cited

U.S. PATENT DOCUMENTS

| 6,534,792 B1 | 3/2003 | Schaffer |
| 7,202,569 B2 | 4/2007 | Tomono |
| 9,876,000 B2 | 1/2018 | Bibl et al. |

(Continued)

FOREIGN PATENT DOCUMENTS

| EP | 582084 A2 | 2/1994 |
| EP | 1601012 A2 | 11/2005 |

OTHER PUBLICATIONS

Chelikowsky et. al. "Melting point trends in intermetallic alloys", Journal of Physics and Chemistry of Solids vol. 48, Issue 2, 1987, pp. 197-205 (Year: 1987).*

*Primary Examiner* — Sitaramarao S Yechuri
(74) *Attorney, Agent, or Firm* — Dinsmore & Shohl LLP

(57) ABSTRACT

An assembly that includes a first substrate, a second substrate, and a pair of bonding layers disposed between and bonded to the first and second substrates. The assembly further includes a solder layer disposed between the pair of bonding layers such that the solder layer is isolated from contacting the first substrate and the second substrate. The solder layer has a low melting temperature relative to a high melting temperature of the bonding layers. A coating is disposed over at least the pair of bonding layers and the solder layer such that the coating encapsulates the solder layer between the pair of bonding layers. The solder layer melts into a liquid form when the assembly operates at a temperature above the low melting temperature of the solder layer and the coating maintains the liquid form of the solder layer between the pair of bonding layers.

18 Claims, 3 Drawing Sheets

(56) References Cited

U.S. PATENT DOCUMENTS

| | | | | |
|---|---|---|---|---|
| 2004/0200879 A1* | 10/2004 | Lewis | ............... | B23K 35/302 |
| | | | | 228/56.3 |
| 2007/0215996 A1* | 9/2007 | Otremba | ............ | H01L 23/4334 |
| | | | | 257/678 |
| 2008/0105907 A1* | 5/2008 | Otremba | ............ | H01L 23/3107 |
| | | | | 257/288 |
| 2009/0051016 A1* | 2/2009 | Galesic | ............... | H01L 23/24 |
| | | | | 257/669 |
| 2012/0235291 A1* | 9/2012 | Uchida | ............... | H01L 23/42 |
| | | | | 257/706 |
| 2015/0024555 A1* | 1/2015 | Shimizu | ............ | H01L 23/49816 |
| | | | | 438/125 |
| 2015/0029670 A1* | 1/2015 | Ohnishi | ............... | C22C 13/00 |
| | | | | 361/714 |
| 2016/0365323 A1* | 12/2016 | Viswanathan | .......... | H01L 21/78 |
| 2018/0159503 A1 | 6/2018 | Takano | | |

* cited by examiner

POWER ELECTRONIC ASSEMBLIES WITH SOLDER LAYER AND EXTERIOR COATING, AND METHODS OF FORMING THE SAME

TECHNICAL FIELD

The present specification generally relates to bonding materials, and more particularly, bonding materials that bond semiconductor devices to substrates and provide stress mitigation characteristics to the semiconductor devices.

BACKGROUND

Power electronics devices are often utilized in high-power electrical applications, such as inverter systems for hybrid electric vehicles and electric vehicles. Such power electronics devices include power semiconductor devices such as power IGBTs and power transistors thermally bonded to a substrate. The substrate may then be further bonded to a cooling structure, such as a heat sink. With advances in battery technology and increases in electronics device packaging density, operating temperatures of power electronics devices have increased and are currently approaching 200° Celsius which generate increased thermomechanical stresses on the power electronic devices, thereby requiring cooling structures of increased size. Accordingly, alternative structures providing stress mitigation for power electronics devices are desired.

SUMMARY

In one embodiment, an assembly includes a first substrate, a second substrate, and a pair of bonding layers disposed between and bonded to the first and second substrates. The assembly further includes a solder layer disposed between the pair of bonding layers such that the solder layer is isolated from contacting the first substrate and the second substrate. The solder layer has a low melting temperature relative to a high melting temperature of the bonding layers. A coating is disposed over at least the pair of bonding layers and the solder layer such that the coating encapsulates the solder layer between the pair of bonding layers. The solder layer melts into a liquid form when the assembly operates at a temperature above the low melting temperature of the solder layer and the coating maintains the liquid form of the solder layer between the pair of bonding layers.

In another embodiment, a power electronic assembly includes a metal substrate having a bonding surface and a nonbonding surface, a semiconductor device having a corresponding bonding surface and a nonbonding surface, a first intermetallic compound layer bonded to the bonding surface of the metal substrate and a second intermetallic compound layer bonded to the bonding surface of the semiconductor device. The first and second intermetallic compound layers are disposed between the metal substrate and the semiconductor device. The assembly includes a solder layer disposed between and bonded to the first and second intermetallic compound layers, and a coating extending along at least a portion of the nonbonding surfaces of the metal substrate and the semiconductor device to seal the solder layer between the metal substrate and the semiconductor device.

In another embodiment, a method of manufacturing an assembly that includes a solder layer having a low melting temperature, the method including: depositing a solder layer onto a first substrate; positioning a second substrate against the solder layer opposite from the first substrate such that the solder layer is disposed between the first and second substrates; heating the solder layer such that portions of the solder layer diffuse into the first and second substrates thereby forming a first bond layer between the solder layer and the first substrate and a second bond layer between the solder layer and the second substrate; coating an external surface of at least a portion of the first and second substrates with a coating such that the pair of bond layers and the solder layer are encapsulated between the first and second substrates by the coating, wherein the coating seals the solder layer between the first and second substrates at the low melting temperature.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments are directed to bonding assemblies having an encapsulated solder layer. More particularly, bonding assemblies with a first substrate bonded to a second substrate with a pair of bonding layers disposed between the first substrate and the second substrate, and a solder layer disposed between the pair of bonding layers and serving as a stress mitigation layer is provided. As used herein, the term "stress mitigation layer" refers to a bond layer disposed between and bonded to the first substrate and the second substrate that is configured to melt into a liquid form when the bonding assembly operates at a temperature above the low melting temperature of the solder layer to reduce thermomechanical stresses generated on the first substrate and/or the second substrate. A coating is disposed over at least the pair of bonding layers and the solder layer such that the coating encapsulates the solder layer between the pair of bonding layers and maintains the solder layer therein while it is in the liquid form. Various embodiments of stress mitigation layers, bonding assemblies, and methods using stress mitigation layers will be described in greater detail herein.

Figure 1:
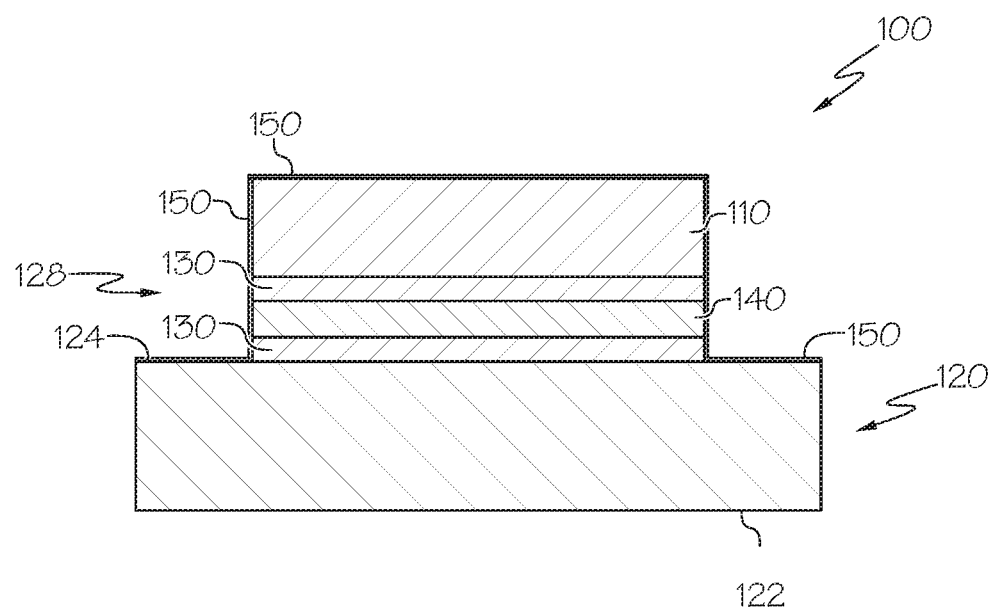
FIG. 1 schematically depicts a cross-sectional view of a bonding assembly having a pair of substrates bonded to one another with a stress mitigation layer and a coating according to one or more embodiments shown and described herein.
Figure 2:
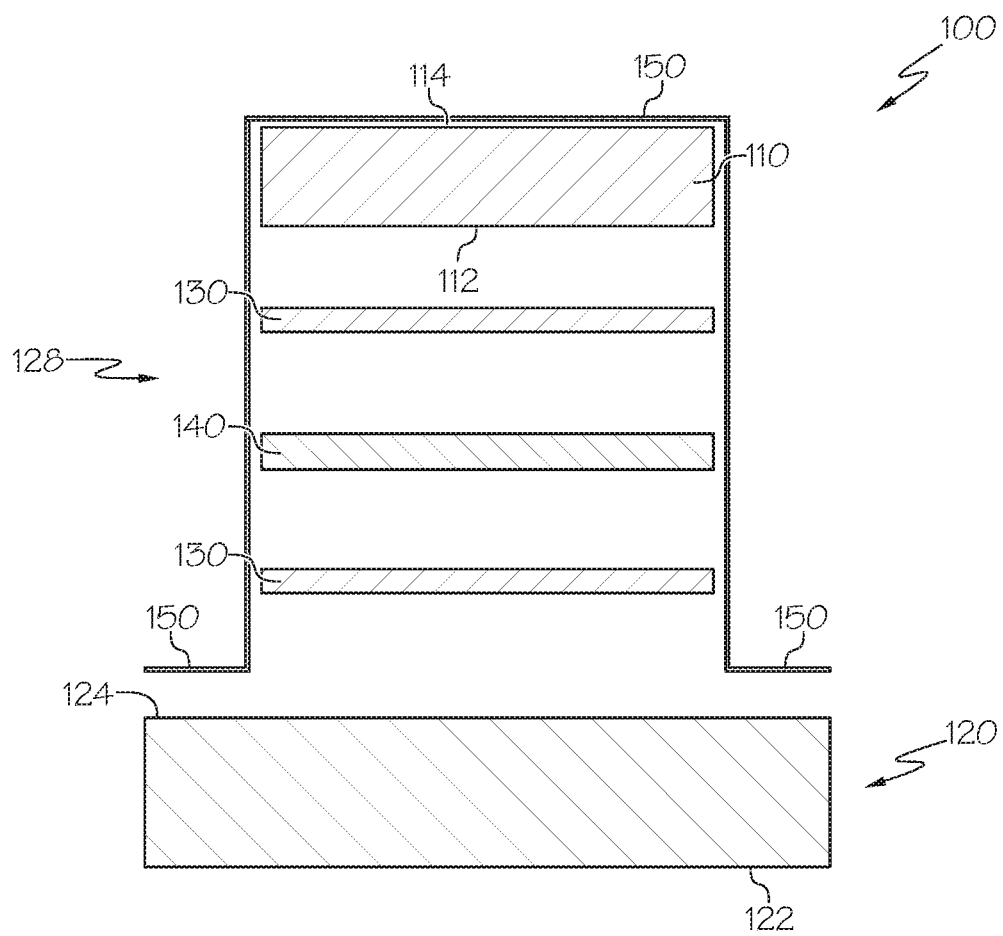
FIG. 2 schematically depicts an exploded cross-sectional view of the stress mitigation layer and coating in FIG. 1 according to one or more embodiments shown and described herein.

Referring now to FIGS. 1 and 2, a non-limiting example of a bonding assembly 100 (e.g., a power electronics assembly) is schematically illustrated. The bonding assembly 100 generally comprises a first substrate 110 bonded to a second substrate 120 via a bonding structure 128 comprising a stress mitigation layer 140 and a pair of bonding layers 130 disposed between and bonded to the first substrate 110 and the second substrate 120, respectively. The first substrate 110 includes a nonbonding surface 112 and a bonding surface 114, and the second substrate 120 includes a nonbonding surface 122 and a bonding surface 124. One of the pair of bonding layers 130 is bonded to the first substrate 110 along the bonding surface 114, and the other bonding layer 130 is bonded to the second substrate 120 along the bonding surface 124. The bonding assembly 100 further includes a stress mitigation layer 140 disposed between the pair of bonding layers 130. The pair of bonding layers 130 may comprise thermally conductive intermetallic compound layers formed within the bonding assembly 100 by transient liquid phase (TLP) bonding of the stress mitigation layer 140 therein.

In some embodiments, the first substrate 110 may be formed from a wide band gap semiconductor material suitable for the manufacture or production of power semiconductor devices such as power insulated-gate bipolar transistors (IGBTs) and power transistors. In some embodiments, the first substrate 110 may be formed from wide band gap semiconductor materials including without limitation silicon carbide (SiC), aluminum nitride (AlN), gallium nitride (GaN), boron nitride (BN), diamond, and the like. Further, in some embodiments the second substrate 120 may any type of substrate for power semiconductor device assemblies known to those skilled in the art. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. As will be described in greater detail herein, the second substrate 120 may be formed from a thermally conductive material such that heat from the first substrate 110 is transferred to the stress mitigation layer 140 interlaid between the first substrate 110 and the second substrate 120.

The first substrate 110 may be power semiconductor devices such as IGBTs, power diodes, power metal-oxide-semiconductor field effect transistors (MOSFETs), power transistors, and the like. In one embodiment, the first substrate 110 of one or more power electronics assemblies form an inverter circuit or system for vehicular applications, such as for hybrid vehicles or electric vehicles, for example. It should be understood that although the first substrate 110 is referred to as a power semiconductor device in the present example, in some embodiments, bonding assembly 100 may include other heat generating devices bonded to the second substrate 120. The first substrate 110 may be thermally coupled to the stress mitigation layer 140 via the bonding layer 130 disposed therebetween, and the second substrate 120 may be thermally coupled to the stress mitigation layer 140 via the bonding layer 130 disposed therebetween.

The stress mitigation layer 140 has a low melting temperature and is configured to reduce thermally induced stresses due to the heat generated by the first substrate 110. In the present example, the stress mitigation layer 140 is formed of a solder (i.e., a low-melting alloy) having a low melting temperature relative to the high melting temperature of the pair of bonding layers 130. In some embodiments, the low melting temperature of the stress mitigation layer 140 may be about 230° Celsius such that the stress mitigation layer 140 is configured to melt in response to the temperature of the bonding assembly 100 exceeding about 230° Celsius. As will be described in greater detail below, the first substrate 110 is configured to generate thermal energy within the bonding assembly 100 at a temperature that causes the stress mitigation layer 140 to transition from a solid state to a liquid state such that the solder melts into a liquefied form within the bonding assembly 100. As a non-limiting example, the stress mitigation layer 140 melts at temperatures greater than or equal to 230° Celsius. In one embodiment, the stress mitigation layer 140 comprises a solder layer formed of tin, and in an alternative embodiment, the stress mitigation layer 140 comprises a solder layer formed of indium. It should be understood that the stress mitigation layer 140 may comprise various other low-melting alloys or metals on metal. As described in greater detail herein, the stress mitigation layer 140, while in the liquid form, is configured to reduce thermomechanical stresses endured by the bonding assembly 100 (i.e., generated by the first substrate 110), and in particular, to mitigate thermally induced stresses on the first substrate 110 and/or the second substrate 120.

The two bonding layers 130 are intermetallic compound layers that are formed by a transient liquid phase (TLP) bonding process. For instance, as the bonding assembly 100 is heated during TLP bonding at a TLP sintering temperature (e.g., about 280° Celsius to about 300° Celsius), the low melting temperature material of the stress mitigation layer 140 melts and becomes partially diffused into the first substrate 110 (which has a high melting temperature coating at the bonding surface 114, such as copper or nickel) and the second substrate 120, thereby forming a bonding layer 130 between the remaining, undiffused portion of the stress mitigation layer 140 and each of the first substrate 110 and the second substrate 120.

Upon cooling the bonding assembly 100, the bonding layers 130 are solidified into intermetallic compound layers by virtue of isothermal solidification. It should be understood that the stress mitigation layer 140 may have an initial thickness sufficient to maintain a portion of the stress mitigation layer 140 disposed within the bonding assembly 100 even after the bonding layers 130 are formed. As a result of this bonding process, the pair of bonding layers 130 has a high melting temperature relative to the low melting temperature of the stress mitigation layer 140 that remains disposed between the pair of bonding layers 130. Accordingly, as will be described in greater detail herein, the pair of bonding layers 130 remain in solid form at the low melting temperature of the stress mitigation layer 140, whereas the stress mitigation layer 140 may transition to a liquid form when the bonding assembly 100 operates at or above the low melting temperature of the material of the stress mitigation layer 140.

As stated above, the stress mitigation layer 140 is disposed between and bonded to the pair of bonding layers 130 such that the stress mitigation layer 140 is further disposed between the first substrate 110 and the second substrate 120. The stress mitigation layer 140 is isolated from contacting the first substrate 110 and the second substrate 120 due to the position of the pair of bonding layers 130 disposed between the stress mitigation layer 140 and the first substrate 110 and the second substrate 120, respectively. Accordingly, the first substrate 110 is bonded to the stress mitigation layer 140 via the bonding layer 130 disposed therebetween, and the second substrate 120 is bonded to the stress mitigation layer 140 via the other bonding layer 130 disposed therebetween. As will be described in greater detail below, more or fewer bonding layers 130 and/or stress mitigation layers 140 may be attached to the first substrate 110 and/or the second substrate 120 of the bonding assembly 100.

The bonding assembly 100 further includes a coating 150 positioned along a portion of an outer surface of the bonding assembly 100. In particular, the coating 150 extends about, and is at least disposed over, the pair of bonding layers 130 and the stress mitigation layer 140 such that the coating 150 encapsulates the stress mitigation layer 140 between the pair of bonding layers 130. In some embodiments, the coating 150 extends along at least a portion of the nonbonding surface 112 of the first substrate 110 and/or at least a portion of the nonbonding surface 122 of the second substrate 120. In this instance, the coating 150 seals the stress mitigation layer 140 between the first substrate 110 and the second substrate 120. In the present example, the coating 150 may be an atomic layer disposition coating that may be any material capable of withstanding the operating temperature of the first substrate 110 (e.g., at or above the low melting temperature of the stress mitigation layer 140). Non-limiting examples of materials for the coating 150 include aluminum and platinum, although other materials may be utilized.

Figure 3:
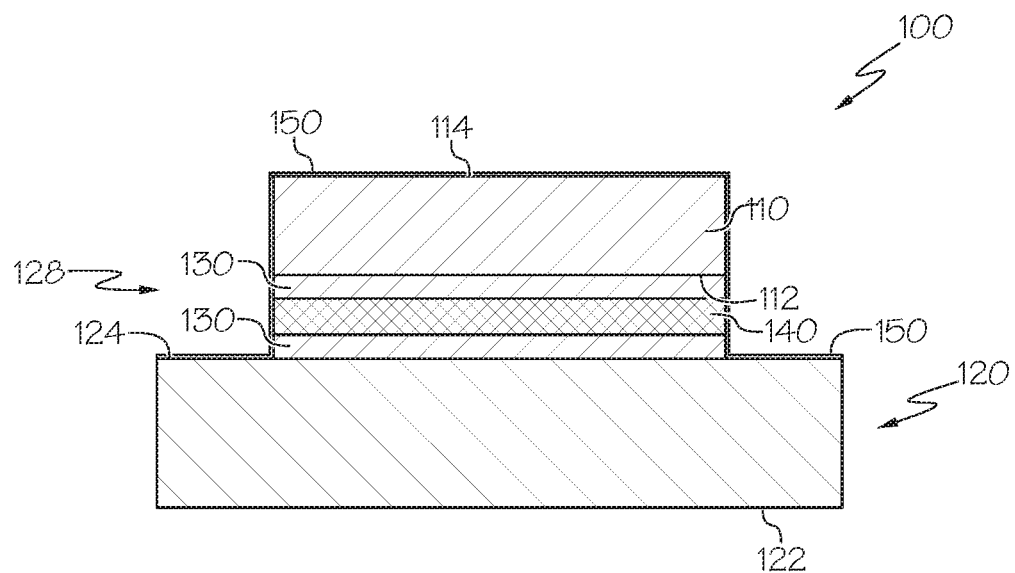
FIG. 3 schematically depicts a cross-sectional view of the bonding assembly of FIG. 1 with the stress mitigation layer in a liquefied state according to one or more embodiments shown and described herein.

Referring now to FIG. 3, the coating 150 maintains the stress mitigation layer 140 within the bonding assembly 100, and in particular between the pair of bonding layers 130 and the pair of substrates 110, 120, when the bonding assembly 100 operates at temperatures exceeding the low melting temperature of the stress mitigation layer 140 (e.g., temperatures exceeding 230° Celsius) while the stress mitigation layer 140 is in the liquid form. It should be understood that the coating 150 is configured to inhibit the stress mitigation layer 140 from leaking out of the bonding assembly 100 while the stress mitigation layer 140 is in the liquid state. While in the liquid state, the stress mitigation layer 140 is configured to relieve thermally induced stresses from within the bonding assembly 100 by facilitating a degree of flexibility within the bonding assembly 100 as the bonding assembly 100 operates at temperatures exceeding the low melting temperature.

In particular, the pair of bonding layers 130 (i.e., intermetallic compound layers) and the second substrate 120 may have varying heat coefficients of thermal expansion (CTE) such that each component of the bonding assembly 100 may experience expansion and/or contraction at various rates and extents as the bonding assembly 100 operates. Accordingly, with the presence of a solid TLP interlayer having a high melting temperature disposed within the bonding assembly 100, in lieu of the stress mitigation layer 140 (i.e., solder layer) having a low melting temperature, the components of the bonding assembly 100 may experience cracking due to the thermal expansion of the bonding layers 130 and/or the second substrate 120. Further, TLP intermetallic compound layers may be brittle, and thus may easily crack within the bonding assembly 100. In the present example, with the stress mitigation layer 140 melted into liquid form while the bonding assembly 100 operates at elevated temperatures above the low melting temperature of the stress mitigation layer 140, the bonding assembly 100 is allowed to flex in response to the thermal expansion and/or contraction of the various components of the bonding assembly 100.

A non-limiting example of a method for using the bonding assembly 100 may include initiating electrical communication through the bonding assembly 100 while the bonding assembly 100 (e.g., a power electronics assembly) is utilized in an electrical application. For example, an electrical application of the bonding assembly 100 may include inverter systems for hybrid vehicles and electric vehicles. In this instance, the bonding assembly 100 is subjected to an operating temperature that approaches or exceeds 200° Celsius.

In this instance, the first substrate 110 (e.g., a power semiconductor device) generates thermal energy, which is imparted on the bonding assembly 100. Accordingly, thermally induced stresses are generated by the first substrate 110 such that the bonding assembly 100 endures thermomechanical stresses therein. As the temperature of the bonding assembly 100 rises during operation, the stress mitigation layer 140 remains in a solid form while the temperature remains below the low melting temperature of the material of the stress mitigation layer 140. In the present example, the low melting temperature of the stress mitigation layer 140 may be about 230° Celsius such that exceeding a temperature threshold of about 230° Celsius causes the stress mitigation layer 140 to melt from the solid form into a liquid form. It should be understood that the temperature threshold is substantially similar to the low melting temperature of the stress mitigation layer 140 such that the threshold may slightly vary depending on the type of solder that the stress mitigation layer 140 is composed of.

With the stress mitigation layer 140 now in a liquefied form, the coating 150 disposed about the exterior surfaces of at least a portion of the first substrate 110, the second substrate 120, the pair of bonding layers 130, and the stress mitigation layer 140, serves to maintain the liquefied stress mitigation layer 140 within the bonding assembly 100. In particular, the coating 150 seals the liquid of the stress mitigation layer 140 between the pair of bonding layers 130 such that the liquid is encapsulated therein and inhibited from leaking out of the bonding assembly 100.

As the bonding assembly 100 continues to be utilized in the high-power electrical application, the first substrate 110 continues to generate thermal energy within the bonding assembly 100, which thereby continues to impart thermally induced stresses onto the bonding assembly 100. However, with the stress mitigation layer 140 transitioned into the liquefied form, the liquid disposed between the pair of bonding layers 130 aids in mitigating and/or inhibiting the thermomechanical stresses endured by the bonding assembly 100, and in particular, by the first substrate 110 and/or the second substrate 120. The liquid of the stress mitigation layer 140 provides a softer material disposed between the first substrate 110 and the second substrate 120, as compared to a solid interlayer (e.g., TLP interlayer), such that the liquefied stress mitigation layer 140 is capable of absorbing the thermomechanical stresses generated within the bonding assembly 100.

In this instance, the bonding assembly 100 exhibits enhanced stress mitigation characteristics while the bonding assembly 100 operates at elevated temperatures of about 230° Celsius or greater. Ultimately, the presence of a liquefied stress mitigation layer 140 within the bonding assembly 100 as the bonding assembly 100 operates at temperatures exceeding the threshold may contribute toward an increased life expectancy for the bonding assembly 100.

Figure 4:
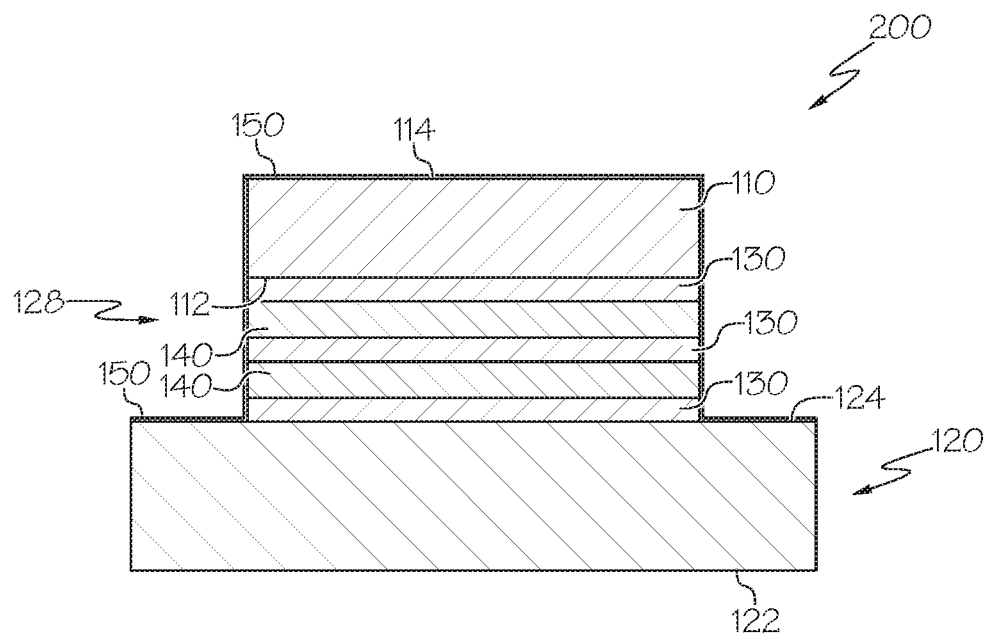
FIG. 4 schematically depicts a cross-sectional view of another bonding assembly having a pair of substrates bonded to one another with a pair of stress mitigation layers and a coating according to one or more embodiments shown and described herein.

As briefly described above, in some embodiments the bonding assembly 100 may include more or fewer stress mitigation layers 140 and/or bonding layers 130 disposed between the first substrate 110 and the second substrate 120. Referring now to FIG. 4, a non-limiting example of a bonding assembly 200 (e.g., a power electronics assembly)

is schematically illustrated. Except for the differences explicitly noted herein, it should be understood that the bonding assembly 200 is substantially similar to the bonding assembly 100 described above such that the bonding assembly 200 may be configured and operable just like the bonding assembly 100. Therefore, identical or substantially similar components are marked with the same reference numerals, without further discussion. It should be understood that any components and operabilities of the bonding assembly 200 that are not described explicitly below may be the same as the components and operabilities of the bonding assembly 100 described above.

The bonding assembly 200 comprises the first substrate 110 bonded to the second substrate 120 with a pair of stress mitigation layers 140 disposed therebetween. The pair of stress mitigation layers 140 are separated from contacting the first substrate 110 and the second substrate 120 by a bonding layer 130 disposed between each stress mitigation layer 140 and the neighboring first and second substrate 110, 120, respectively, as similarly described above. Further, the pair of stress mitigation layers 140 are isolated from one another and separated from contacting the other stress mitigation layer 140 by an additional bonding layer 130 disposed therebetween. In this instance, the coating 150 extends along an outer perimeter of at least the pair of stress mitigation layers 140 and the three bonding layers 130 to thereby encapsulate and seal the pair of stress mitigation layers 140 within the bonding layers 130. In some embodiments, the coating 150 may be disposed over at least a portion of the nonbonding surface 112 of the first substrate 110 and/or at least a portion of the nonbonding surface 122 of the second substrate 120, in addition to the side portions of the pair of stress mitigation layers 140 and the bonding layers 130. It should be understood that, in many respects, the bonding assembly 200 is fabricated and functions substantially similar to the bonding assembly 100 such that the description below with respect to FIG. 5 is equally applicable to the bonding assembly 200.

Figure 5:
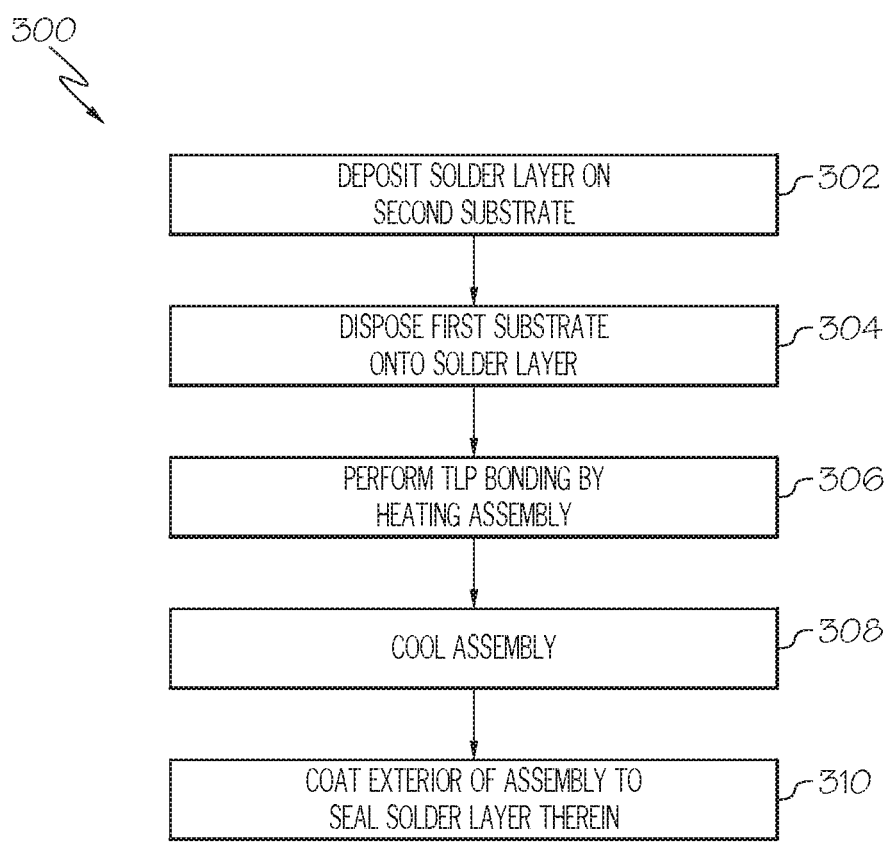
FIG. 5 is a flow chart of a method for fabricating the bonding assembly of FIG. 1 according to one or more embodiments shown and described herein.

Referring now to the flow chart of FIG. 5, a process 300 for forming the bonding assembly 100 with the stress mitigation layer 140 described above is shown. It should be understood that process 300 is merely illustrative and that the bonding assembly 100 may be formed in various other methods. Initially at step 302, the stress mitigation layer 140 is deposited onto the second substrate 120. In particular, the stress mitigation layer 140 may be electrodeposited along a bonding surface 124 of the second substrate 120 such that the stress mitigation layer 140 is securely plated against the second substrate 120. In some embodiments, the stress mitigation layer 140 is a film that is placed on the second substrate 120. In the present example, as described above, the stress mitigation layer 140 comprises a solder layer. At step 304, the first substrate 110 is disposed onto the stress mitigation layer 140 (i.e., the solder layer) along a surface of the stress mitigation layer 140 that is opposite of the surface deposited against the bonding surface 124 of the second substrate 120. Accordingly, the bonding surface 114 of the first substrate 110 is disposed onto the stress mitigation layer 140. It should be understood that the bonding surface 114 of the first substrate 110 may be coated with a metal or metal alloy having a high melting temperature material used in TLP bonding processes. For example, the high melting temperature material coated along the bonding surface 114 may be copper, nickel, and/or the like.

At step 306, the assembly of the stress mitigation layer 140 disposed between the substrates 110, 120 undergoes TLP bonding to thereby bond the first substrate 110 to the second substrate 120 with the stress mitigation layer 140 disposed therein. During the TLP bonding process, outer-edge portions of the stress mitigation layer 140 melt in response to the heating and an element of the stress mitigation layer 140 (i.e. a constituent of an alloy of the stress mitigation layer 140) is partially diffused into the first and second substrates 110, 120. In this instance, intermetallic bonds occur between the material of the stress mitigation layer 140 and the material of the substrates 110, 120 thereby forming a bonding layer 130 (i.e., an intermetallic compound layer) extending between the first substrate 110 and the stress mitigation layer 140, and another bonding layer 130 extending between the second substrate 120 and the stress mitigation layer 140. The pair of bonding layers 130 are formed as a result of the homogenization of an interface region between the stress mitigation layer 140 and the bonding surfaces 114, 124 of the substrates 110, 120, respectively. In some embodiments, the bonding assembly 100 may include a feature or fixture that is sized and configured to maintain the stress mitigation layer 140 therein during the TLP bonding process. In this instance, the fixture inhibits the stress mitigation layer 140 from leaking out of the bonding assembly 100 as the first substrate 110 is bonded to the second substrate 120 at the TLP sintering temperatures with the stress mitigation layer 140 disposed therebetween.

It should be understood that the stress mitigation layer 140 comprises a thickness that is sufficiently sized to maintain a solder layer within the bonding assembly 100 after a portion of the stress mitigation layer 140 diffuses into the adjacent substrates 110, 120 to form the bonding layers 130. Accordingly, the remaining solder layer disposed between the pair of bonding layers 130 after the TLP bonding process is effectively an undiffused portion of the stress mitigation layer 140. In other words, only a portion and/or region of the stress mitigation layer 140 that is in direct contact with the bonding surfaces 114, 124 of the substrates 110, 120, are diffused into the substrates 110, 120 such that an undiffused portion of the stress mitigation layer 140 remains disposed between the pair of bonding layers 130 formed therein.

At step 308, the bonding assembly 100 is cooled to thereby solidify the bonds between the first substrate 110, the second substrate 120, the bonding layers 130, and the stress mitigation layer 140. At step 310, at least a portion of an exterior of the bonding assembly 100 is coated with the coating 150 to encapsulate the stress mitigation layer 140 (i.e., the solder layer) between the pair of bonding layers 130 (i.e. the intermetallic compound layers). In particular, at least an exterior of the pair of bonding layers 130 and the stress mitigation layer 140 is coated with the coating 150 to seal the layers 130, 140 to the bonding assembly 100. As described above, the coating 150 may be an atomic layer disposition coating that may be formed of a high melting temperature material (i.e., material capable of withstanding the TLP sintering temperature of about 280° Celsius to about 300° Celsius). For example, the high melting temperature material of the coating 150 may comprise platinum, aluminum, and/or the like. An additional portion of the bonding assembly 100 may be coated with the coating 150 to further seal the stress mitigation layer 140 within the bonding assembly 100. In particular, the nonbonding surface 112 of the first substrate 110 and/or the nonbonding surface 122 of the second substrate 120 may be encapsulated by the coating 150 to further seal the pair of bonding layers 130 and the stress mitigation layer 140 to the first and second substrates 110, 120.

In some embodiments, the coating 150 may be disposed within the bonding assembly 100 such that the coating 150 is positioned between the core layers of the bonding assembly 100. For example, in some instances the coating 150 may be applied between the bonding layers 130 and the substrates 110, 120. With the coating 150 being formed of a high melting temperature material configured to withstand the TLP sintering temperatures endured by the bonding assembly 100 during the TLP bonding process (e.g., about 280° Celsius to about 300° Celsius), the coating 150 remains intact and disposed within the bonding assembly 100.

It should be understood that other configurations and examples of the arrangement of the bonding assembly 100 may be used to provide the stress mitigation characteristics of the stress mitigation layer 140 described above. For example, as noted above, the bonding assembly may include more or fewer stress mitigation layers and/or bonding interlayers, such as the bonding assembly 200 described above. Alternatively, an additional stress mitigation layer 140 may be bonded to the bonding assembly 100 along a top surface (i.e. the nonbonding surface 112) of the first substrate 110 such that a bonding layer 130 is also formed therebetween along the nonbonding surface 112.

As stated above, the bonding assemblies 100, 200 described above may be incorporated into an inverter circuit or system that converts direct current electrical power into alternating current electrical power, and vice versa, depending on the particular application. Power semiconductor devices utilized in such vehicular applications may generate a significant amount of thermally induced stresses during operation thereby requiring cooling of the semiconductor devices. The stress mitigation layer described above and illustrated herein may be bonded to the bonding assembly to mitigate the thermomechanical stresses generated by the semiconductor device to thereby cool the assembly while also providing a compact package design.

It should now be understood that the stress mitigation layer in the bonding assembly (e.g., power electronics assembly) and vehicles described herein may be utilized for mitigating thermally induced stresses endured by the assembly to cool the semiconductor devices without the need for complex cooling circuits, thereby providing a more compact package design. Particularly, the stress mitigation layers described herein may be bonded to substrates that generate thermomechanical stresses during operation and the stress mitigation layers are configured to melt into a liquid form thereby mitigating the stresses in the assembly. An atomic coating disposed about the stress mitigation layers are configured to encapsulate the stress mitigation layer within the assembly to prevent the liquid from leaking out of the assembly.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "lower", "upper" and "middle" are used in relation to the figures and are not meant to define an exact orientation of power electronics assemblies or layers used to form electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An assembly comprising:
   a first substrate;
   a second substrate;
   a pair of bonding layers disposed between and bonded to the first and second substrates;
   a solder layer disposed between the pair of bonding layers such that the solder layer is isolated from contacting the first substrate and the second substrate, wherein the solder layer has a low melting temperature relative to a high melting temperature of the bonding layers;
   a second solder layer disposed between the pair of bonding layers and separated from the solder layer by a third bonding layer positioned therebetween; and
   a coating disposed over at least the pair of bonding layers and the solder layer such that the coating encapsulates the solder layer between the pair of bonding layers;
   wherein the solder layer melts into a liquid form when the assembly operates at a temperature above the low melting temperature of the solder layer and the coating maintains the liquid form of the solder layer between the pair of bonding layers.

2. The assembly of claim 1, wherein the low melting temperature of the solder layer is greater than or equal to 230 degrees Celsius.

3. The assembly of claim 2, wherein the high melting temperature of the pair of bonding layers is such that the pair of bonding layers remain in solid form at the low melting temperature.

4. The assembly of claim 1, wherein the solder layer is formed of tin.

5. The assembly of claim 1, wherein the coating comprises an atomic layer disposition coating formed of aluminum or platinum.

6. The assembly of claim 1, wherein the solder layer reduces thermomechanical stresses of the assembly when in the liquid form.

7. The assembly of claim 1, wherein the pair of bonding layers comprises transient liquid phase bonding interlayers.

8. The assembly of claim 1, wherein the first substrate comprises silicon.

9. The assembly of claim 1, wherein the second substrate comprises copper.

10. The assembly of claim 1, wherein the coating is disposed over at least the first substrate such that the pair of bonding layers, the solder layer and the first substrate are encapsulated within the coating.

11. The assembly of claim 10, wherein the coating is further disposed over at least a portion of the second substrate such that the pair of bonding layers, the solder layer, the first substrate and at least the portion of the second substrate are encapsulated within the coating.

12. A power electronic assembly comprising:
   a metal substrate having a bonding surface and a nonbonding surface;
   a semiconductor device having a corresponding bonding surface and a nonbonding surface;
   a first intermetallic compound layer bonded to the bonding surface of the metal substrate;
   a second intermetallic compound layer bonded to the bonding surface of the semiconductor device, wherein the first and second intermetallic compound layers are disposed between the metal substrate and the semiconductor device;

a solder layer disposed between and bonded to the first and second intermetallic compound layers; and a coating extending along at least a portion of the non-bonding surfaces of the metal substrate and the semiconductor device to seal the solder layer between the metal substrate and the semiconductor device, wherein the coating comprises an atomic layer disposition coating formed of aluminum or platinum.

13. The power electronic assembly of claim 12, wherein the solder layer transitions to a liquid state in response to the semiconductor device generating thermal energy.

14. The power electronic assembly of claim 13, wherein the liquid state of the solder layer mitigates thermally induced stresses generated by the semiconductor device.

15. The power electronic assembly of claim 13, wherein the coating inhibits the solder layer from leaking out from between the first and second intermetallic compound layers while the solder layer is in the liquid state.

16. The power electronic assembly of claim 12, wherein the solder layer comprises a lower melting temperature relative to the first and second intermetallic compound layers.

17. A method of manufacturing an assembly comprising a solder layer having a low melting temperature relative to a high melting temperature of at least one bonding layer, the method comprising:

depositing a solder layer onto a first substrate;

positioning a second substrate against the solder layer opposite from the first substrate such that the solder layer is disposed between the first and second substrates;

depositing a second solder layer against the solder layer and positioning the second substrate against the second solder layer prior to heating such that the first and second solder layers are disposed between the first and second substrates;

heating the solder layer such that portions of the solder layer diffuse into the first and second substrates thereby forming a first bond layer between the solder layer and the first substrate and a second bond layer between the solder layer and the second substrate;

coating an external surface of at least a portion of the first and second substrates with a coating such that the pair of bond layers and the solder layer are encapsulated between the first and second substrates by the coating, wherein the coating seals the solder layer between the first and second substrates at the low melting temperature.

18. The method of claim 17, wherein the second substrate includes a copper or nickel surface such that the copper or nickel surface of the second substrate is positioned against the solder layer.

\* \* \* \* \*